United States Patent [19]

Baliga et al.

[11] 4,251,299
[45] Feb. 17, 1981

[54] PLANAR EPITAXIAL REFILL USING LIQUID PHASE EPITAXY

[75] Inventors: Bantval J. Baliga, Clifton Park; Gerald B. Gidley, Averill Park, both of N.Y.

[73] Assignee: General Electric Company, Schenectady, N.Y.

[21] Appl. No.: 67,564

[22] Filed: Aug. 17, 1979

[51] Int. Cl.³ .......................................... H01L 21/208
[52] U.S. Cl. .................................. 148/171; 148/172; 427/86
[58] Field of Search .................... 148/171, 172; 427/86

[56] References Cited

U.S. PATENT DOCUMENTS

| | | | |
|---|---|---|---|
| 3,647,578 | 3/1972 | Barnett et al. | 148/171 |
| 3,697,336 | 10/1972 | Lamorte | 148/171 |
| 3,936,328 | 2/1976 | Nakata | 148/171 |
| 4,070,205 | 1/1978 | Rahilly | 148/171 X |
| 4,128,440 | 12/1978 | Baliga | 148/171 |
| 4,142,924 | 3/1979 | Hsieh | 148/171 |

OTHER PUBLICATIONS

Smeltzer, J. Electrochem. Soc., vol. 122, Dec. 1975, pp. 1666–1671.
Baliga, J. Electrochem. Soc., vol. 124, Oct. 1977, pp. 1627–1631.

*Primary Examiner*—G. Ozaki
*Attorney, Agent, or Firm*—Marvin Snyder; James C. Davis

[57] ABSTRACT

Planar silicon device structures are fabricated by refilling grooves etched in an oxide-coated silicon substrate using liquid phase epitaxial growth from a tin melt. Since tin does not wet silicon dioxide, silicon nucleation on the oxide-covered areas of the substrate is precluded. Consequently, epitaxial growth selectively occurs in the grooves, without undesirable silicon growth over the oxide. This avoids the short-circuits and surface nonplanarity resulting from the growth of polycrystalline silicon on the oxide layer covering the unetched areas when vapor phase epitaxial growth is employed.

18 Claims, 11 Drawing Figures

PLANAR EPITAXIAL REFILL USING LIQUID PHASE EPITAXY

INTRODUCTION

This invention relates to fabrication of planar silicon device structures, and more particularly to a method of producing planar silicon device structures by refilling grooves in an oxide-coated substrate using liquid phase epitaxial growth.

Planar device structures have been produced using vapor phase epitaxial growth to refill grooves etched in a <110> silicon substrate, as set forth by R. K. Smeltzer, "Epitaxial Deposition of Silicon in Deep Grooves", *Journal of the Electrochemical Society*, Vol. 122, No. 12, Pages 1666-1671, December 1975. In the study by Smeltzer, the unetched portions of the silicon wafer were not protected by a masking layer. In addition to the epitaxial growth inside the grooves, a very thin epitaxial growth occurred on the exposed unetched regions of the wafer, interconnecting the refilled grooves. Such structure can be useful in fabricating vertical multi-channel solar cells.

In the case of a field controlled thyristor (FCT) or a field effect transistor (FET), it is desirable to employ refilled grooves etched in a semiconductor having a planar surface, but without any epitaxial growth over the unetched surface since the cathode or source of the FCT or FET, respectively, must be located in this area. To fabricate these structures, it is conventional to refill the grooves by use of vapor phase epitaxy while employing an oxide layer on the unetched areas to prevent epitaxial deposition of silicon thereon. Although good refilling of the grooves has been achieved in this manner some polycrystalline silicon has been found to grow on the oxide layer. This poly-silicon can act as a short circuit between the grooves, and also can lead to a non-planar surface which makes subsequent photolithographic processing more difficult.

B. J. Baliga et al. application Ser. No. 938,020 filed Aug. 30. 1978, a continuation-in-part of application Ser. No. 863,877, filed Dec. 23, 1977, now abandoned both assigned to the instant assignee, describes and claims a method of selectively refilling etched channels by epitaxial growth from the vapor phase in order to fabricate high voltage vertical channel junction gate FETs. Polycrystalline silicon deposits produced epitaxially atop a layer of silicon dioxide on the substrate surface between successive grooves must be removed, however, as by etching.

In B. J. Baliga U.S. Pat. No. 4,128,440, issued Dec. 5, 1978 and assigned to the instant assignee, a liquid phase epitaxial method of covering buried regions in silicon devices is described and claimed. The advantage of avoiding polycrystalline deposits on silicon oxide-coated regions of the device by use of liquid phase epitaxial growth is therein pointed out. It would be desirable to employ a liquid phase epitaxial method of fabricating devices with refill etched channels, of the type described and claimed in the aforementioned Baliga et al. application Ser. No. 938,020, so as to avoid need for subsequent removal of polycrystalline silicon deposits atop an oxide coating between successive grooves in the substrate.

Accordingly, one object of the invention is to refill grooves etched in silicon substrates having oxide-coated nonetched regions without causing short circuits between the grooves.

Another object is to refill grooves etched in planar silicon substrates having oxide-coated nonetched regions without producing a nonplanar silicon surface on the substrate.

Another object is to provide a liquid phase epitaxial growth process for refilling grooves etched in silicon substrates having oxide-coated nonetched regions, without causing growth of polycrystalline silicon atop the oxide layer.

Briefly, in accordance with a preferred embodiment of the invention, a method of refilling grooves in a silicon wafer by epitaxial growth from the liquid phase comprises establishing an oxide layer on a surface of the wafer, and forming a plurality of grooves extending into the wafer through the oxide layer such that the oxide layer masks the wafer surface between adjacent grooves. The wafer is then inserted into a melt at least saturated with silicon and containing conductivity type-determining impurities, and the melt is cooled at a controlled rate below 0.3° C. per minute for a predetermined duration so as to fill the grooves with epitaxially-grown silicon to a desired extent. The wafer is then withdrawn from the melt and the oxide mask may be removed.

In accordance with another preferred embodiment of the invention, a method of refilling grooves in a silicon wafer by epitaxial growth from the liquid phase comprises establishing an oxide layer on a surface of the wafer, and forming a plurality of grooves extending into the wafer through the oxide layer such that the oxide layer masks the wafer surface between adjacent grooves. The wafer is then inserted into a melt supersaturated with silicon and containing conductivity type-determining impurities, and the melt is maintained at a constant temperature for a predetermined duration so as to fill the grooves with epitaxially-grown silicon to a desired extent. The wafer is then withdrawn from the melt and the oxide mask may be removed.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DESCRIPTION OF TYPICAL EMBODIMENTS

Figure 1A:
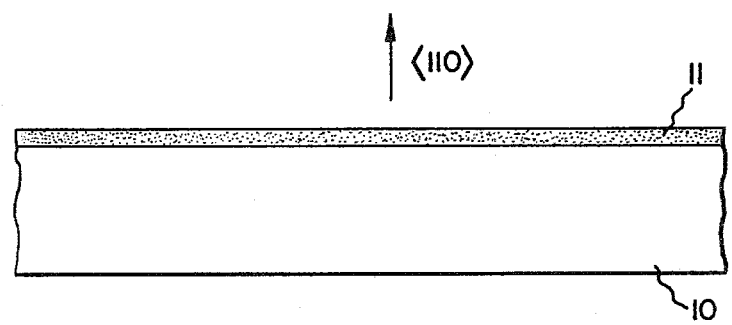
FIGS. 1A-1E are cross-sectional views of a silicon wafer illustrating a sequence of operations in which grooves are formed in the wafer and refilled flush to their tops by epitaxial growth of silicon from the liquid phase.

FIGS. 1A–1E illustrate use of the liquid epitaxial process of the instant invention in refilling deep grooves in silicon to produce vertical junction solar cells or high voltage vertical channel junction gate FETs. As shown in FIG. 1A, an oxide layer 11 is grown on a silicon wafer 10 in either dry oxygen or steam at an elevated temperature of between 900° C. and 1250° C. The wafer as illustrated in FIG. 1A is <110> oriented N-type, with P-type epitaxial refill to be performed. However, the technique is also applicable to other wafer orientations and, in general, both P-type and N-type refill regions can be achieved in both P-type and N-type substrates.

Figure 1B:
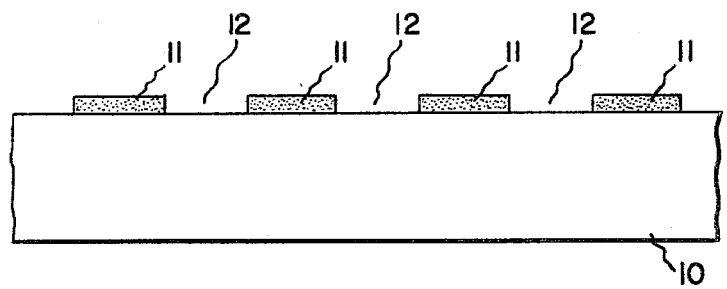

As shown in FIG. 1B, oxide layer 11 is next patterned atop silicon substrate 10 by photolithographic techniques well known in the planar semiconductor device art, so that windows 12 are opened in those regions of oxide layer 11 where grooves are to be formed.

Figure 1C:
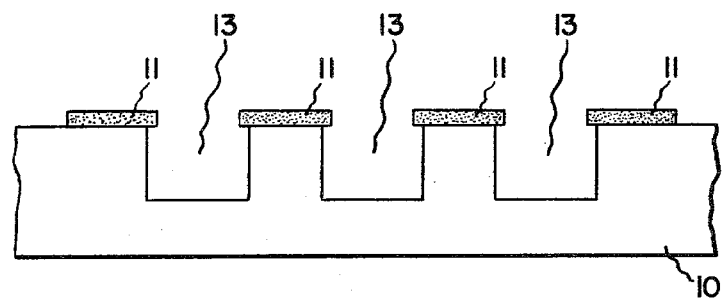

Vertically-walled grooves 13 are next produced in silicon substrate 10, as shown in FIG. 1C. In <110> oriented silicon, this is achieved by use of an orientation-dependent etching agent, such as a mixture of potassium hydroxide, isopropanol, and water. Oxide layer 11 acts as a protective mask for the silicon during this step, essentially preventing attack by the etching agent of the silicon under the oxide. At this stage, the wafer is ready for refill of the grooves by epitaxial growth from the liquid phase.

Figure 1D:
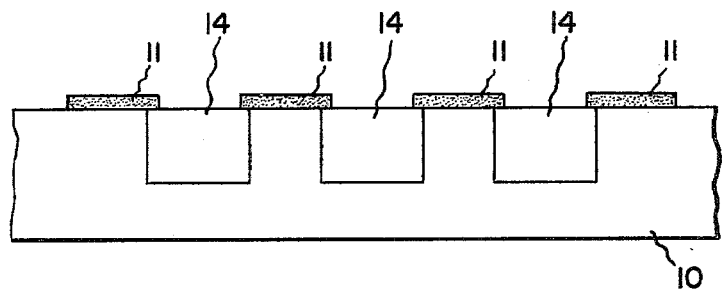

In FIG. 1D, substrate 10 is shown refilled with epitaxially-grown silicon 14 in the former grooved regions. A detailed description of the apparatus and tin melt saturation employed in the liquid phase epitaxial growth procedure, as well as the growth procedure itself, are set forth in B. J. Baliga, "Kinetics of the Epitaxial Growth of Silicon from a Tin Melt", *Journal of the Electrochemical Society*, 124, 1627–1631 (October 1977), as well as in B. J. Baliga U.S. Pat. No. 4,128,440, issued Dec. 5, 1978 and assigned to the instant assignee.

Figure 1E:
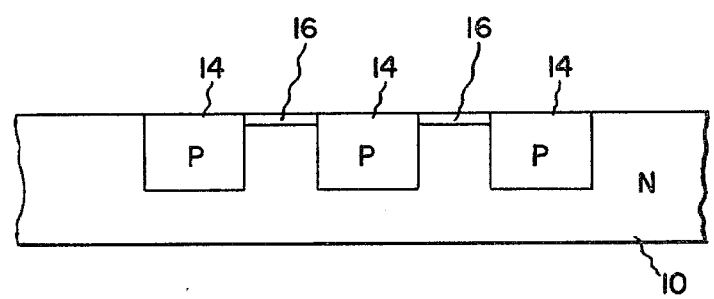

The vertical multijunction solar cell structure illustrated in FIG. 1E is completed by removing oxide layer 11, shown in FIG. 1D, by etching in hydrofluoric acid, for example. Assuming substrate 10 is of N-type conductivity, and the grooves are refilled with P-type conductivity silicon, the resulting deep P regions are then electrically connected at the top by diffusing a shallow P-type region 16 into the surface of wafer 10.

By employing this liquid phase epitaxial deposition process instead of vapor phase epitaxial deposition, the epitaxial growth of silicon occurs at a lower temperature and consequently requires expenditure of less energy than vapor phase epitaxial growth. Moreover, the liquid phase growth is performed with complete conservation of silicon, since waste due to unreacted input gases and reaction by-products is eliminated. Additionally, since growth is performed using a liquid solvent for the silicon, such as tin or a tin/lead mixture, the liquid acts as a getter for removing lifetime-reducing impurities, resulting in high lifetimes for the devices fabricated by this procedure.

Figure 2:
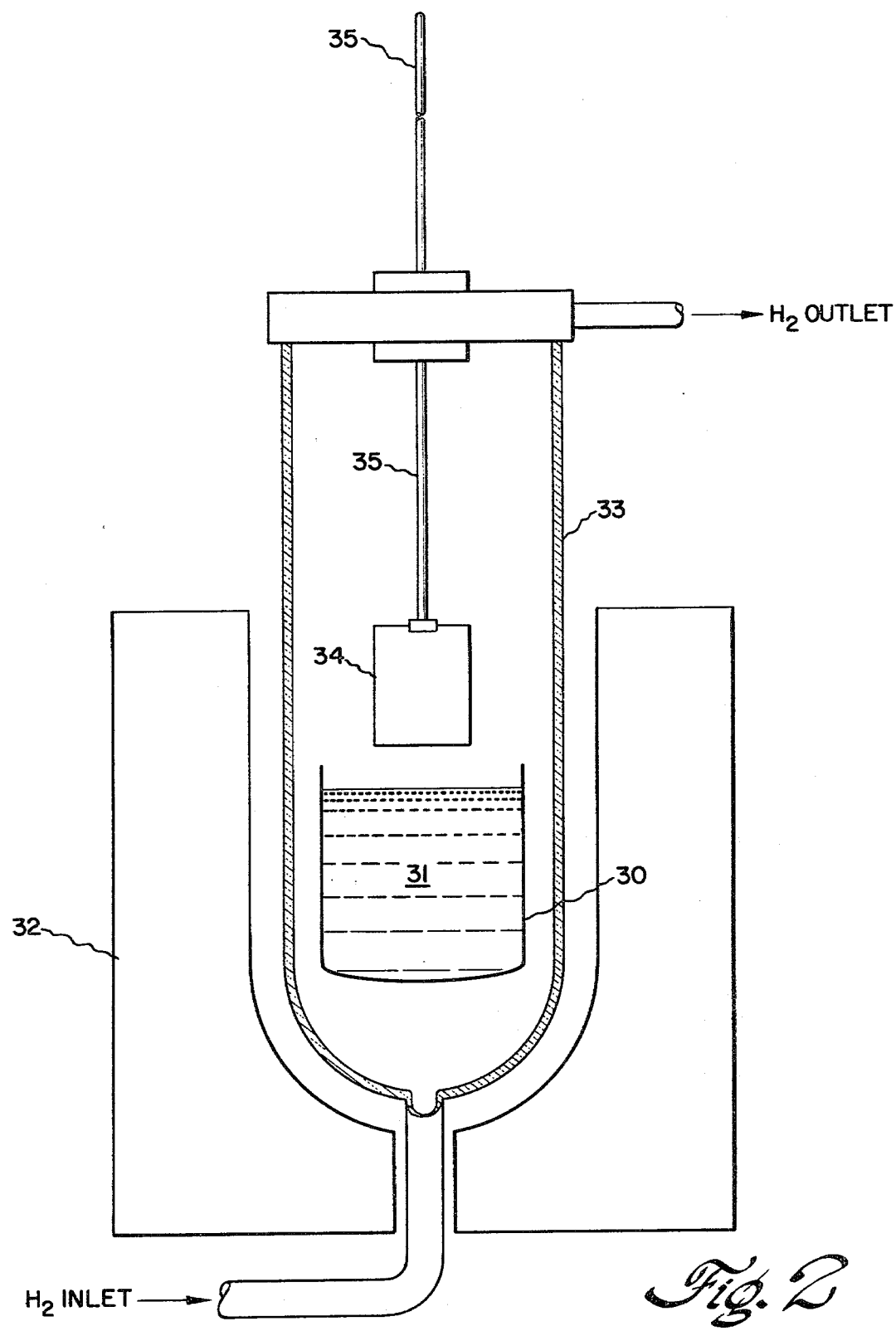
FIG. 2 is a schematic diagram of apparatus employed in growing silicon epitaxially from the liquid phase.

FIG. 2 illustrates apparatus which may be employed in practicing the liquid phase epitaxial refill process of the present invention. Thus, a crucible 30, containing a melt of conductivity-type determining impurities 31, is heated in a reducing atmosphere. For epitaxially depositing the silicon layer containing N-type or P-type impurities, a melt of high purity tin is preferably employed, heated to a temperature of 950° C. in a resistance furnace 32 in a hydrogen atmosphere. Alternatively, a tin-lead melt may be employed. The crucible is preferably contained in a quartz tube 33 with the flow of hydrogen gas, as illustrated by the arrows in FIG. 2, preferably being from the bottom of tube 33 toward the top. A wafer holder 34, preferably made of quartz, is attached to a vertical rod 35, also preferably fabricated of quartz, which raises and lowers holder 34.

Prior to growth, tin melt 31 is saturated with silicon from a silicon wafer dipped therein by holder 34. The wafer is preferably of 100 ohm-cms resistivity, and either phosphorus-doped or boron-doped, depending on whether the grooves in the substrate shown in FIG. 1C are to be filled epitaxially with N-type or P-type silicon, respectively. During saturation, the melt is preferably stirred by oscillation of holder 34 about a vertical axis. The saturation is conducted until no further loss in weight of the saturation wafer can be detected. The amount of silicon required to saturate a fresh 99 gram tin melt at 950° C. is 0.47 grams. After each epitaxial growth, the silicon in the melt is preferably replenished using the same procedure.

The epitaxial layer may typically be grown on a <110> oriented, 0.01 ohms-cms, boron-doped silicon substrate with grooves prepared according to the steps illustrated in FIGS. 1A–1C. The substrate is dipped in dilute hydrofluoric acid just before loading into wafer holder 34. The substrate temperature is brought up to the melt temperature by holding the wafer above the melt for about 10 minutes. The wafer is thereafter inserted into the melt, and the melt temperature is lowered at a controlled cooling rate which may range from 0.2° C. to 7° C. per minute. Although not essential, the melt may be slightly supersaturated (by lowering its temperature after saturation) prior to introducing the substrate into the melt, in order to avoid any possible meltback in the grooves of the substrate prior to epitaxial growth.

During cooling of the melt at a controlled cooling rate, silicon containing the implanted conductivity type-determining impurities precipitates out of solution and deposits epitaxially onto the exposed silicon of the substrate. Where the substrate silicon is masked by silicon oxide, epitaxial growth does not occur. Thus the grooves fill with silicon, beginning at the bottom corners of the grooves. Growth time required to fill the grooves may range from a few minutes up to several hours, depending upon the cooling rate, to achieve undercooling of the melt of up to 100° C., the epitaxial growth having been initiated at 950° C. If the proper growth time is selected, the grooves can be refilled to a level flush with their tops, leaving a planar silicon surface after refill, as shown in FIG. 1D. Because tin does not wet silicon dioxide, no nucleation occurs on the oxide areas overlying the silicon substrate. As a result, epitaxial growth occurs selectively in the grooves, without undesirable silicon growth over the oxide areas. This is a major advantage of the liquid phase epitaxial process described herein, as compared to vapor phase epitaxy where polycrystalline silicon is invariably grown over oxide areas overlying the silicon substrate.

At the end of the growth period, the substrate is removed from the melt before furnace cooling is terminated, in order to avoid any possible meltback effects (i.e., penetration of tin into the silicon substrate). If any tin is found to be present on the bottom edge of the wafer after growth, it is preferably removed by etching in aqua regia. Thereafter, processing of the device to completion in conventional fashion may proceed.

Figure 3:
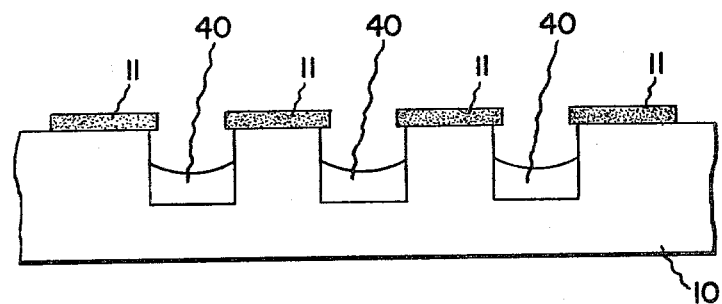
FIG. 3 is a cross-sectional view of a silicon wafer wherein grooves are partially refilled by epitaxial growth of silicon from the liquid phase to create a recessed area in each groove.
Figure 4:
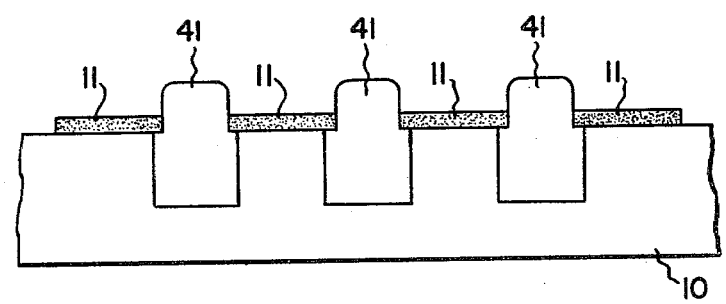
FIG. 4 is a cross-sectional view of a silicon wafer wherein grooves are excessively refilled by epitaxial growth of silicon from the liquid phase to create a protrusion over each groove.

By controlling the epitaxial growth time, it has been found possible to either partially refill the grooves in the substrate to create a recessed area therein, as shown in FIG. 3, or to excessively refill the grooves to create epitaxial growth protrusions over the grooves, as shown in FIG. 4. This technique allows fabrication of devices requiring multiple semiconductor surface levels. Specifically, by reducing epitaxial growth duration, there is insufficient time for the grooves in substrate 10 to fill completely with silicon. As a result, only a partial refill 40 is achieved, with a slightly concave surface due to surface tension effects, as shown in FIG. 3. On the other hand, by increasing epitaxial growth duration, more than enough time elapses for the grooves in substrate 10 to fill to the uppermost surface of substrate 10, and an overflow refill of silicon 41 is achieved, as shown in FIG. 4, without any overlap of silicon on any portion of oxide layer 11.

In order to achieve good epitaxial refill, it is necessary to use only a small cooling rate during the growth cycle. Cooling rates below 0.3° C./min. have been found satisfactory when using the apparatus illustrated in FIG. 2. At high cooling rates (i.e., above 0.5° C./min.), preferential growth of silicon occurs on the upper edges of the grooves near the oxide layer, which can result in growth of vertically-oriented silicon sheets extending upward along at least part of the vertical walls of each groove, beyond the uppermost surface of the oxide layer. Very little silicon growth occurs inside the grooves in such instance. A detailed description of how such vertically-oriented silicon sheets may be grown is contained in G. E. Fenner and B. J. Baliga application Ser. No. 769,199, filed Feb. 16, 1977 and now abandoned.

Figure 5:
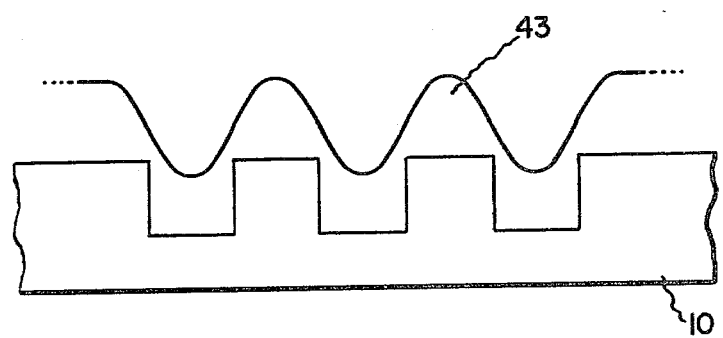
FIG. 5 is a cross-sectional view of a silicon wafer without an oxide layer on the surface, such that epitaxial growth of silicon from the liquid phase occurs both in the grooves and on the upper silicon surface, producing a nonplanar silicon surface after growth.

Refilling of the grooves in substrate 10 can also be performed using the method of the instant invention without establishing an oxide layer on the silicon substrate surface. However, in absence of such oxide layer, epitaxial growth occurs simultaneously in the grooves in substrate 10 and on the upper surface of substrate 10, thereby coating substrate 10 with a nonplanar, continuous layer of silicon 43 after growth, as shown in FIG. 5. This structure, of course, results in short circuits between adjacent grooves due to the adjacent grooves being joined together by the epitaxially-grown silicon.

Epitaxial silicon refill, according to the instant invention, can alternatively be achieved using melt supersaturation without any cooling during the growth period; i.e., by isothermal growth. Although good silicon refill in the substrate grooves can be obtained thereby, growth time is substantially increased in comparison to refill by using the previously-described slow melt-cooling method. As is the case with the slow melt-cooling method, silicon refill of substrate grooves may be performed with or without an oxide layer on the substrate surface, though short circuits of monocrystalline silicon are formed between adjacent grooves in the substrate when no oxide mask is employed.

The foregoing describes a method for refilling grooves etched in silicon substrates having oxide-coated nonetched regions without producing short circuits between the grooves. The method may also be employed to refill grooves etched in planar silicon substrates having oxide-coated nonetched regions without producing a nonplanar silicon surface on the substrate. The grooves are refilled by using a liquid phase epitaxial growth process, and avoids growth of polycrystalline silicon on the oxide layer.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

We claim:

1. A method of refilling grooves in a silicon wafer of predetermined conductivity type by epitaxial growth of silicon from the liquid phase, comprising:
    establishing an oxide layer on a surface of said silicon wafer;
    etching grooves extending into said wafer through said oxide layer;
    inserting said wafer into a melt at least saturated with silicon and containing conductivity type-determining impurities;
    cooling the melt at a controlled rate so as to fill the grooves with epitaxially-grown silicon to a desired extent; and
    withdrawing said wafer from said melt upon termination of said cooling.

2. The method of claim 1 wherein said cooling is terminated when the grooves in said silicon wafer are filled with epitaxially-grown silicon up to the surface of said silicon wafer.

3. The method of claim 2 including the step of removing said oxide layer from said wafer after said wafer is withdrawn from said melt.

4. The method of claim 5 including the step of diffusing impurities into the ungrooved surface portion of said wafer previously covered by said oxide layer so as to electrically interconnect successive filled grooves containing epitaxially grown silicon.

5. The method of claim 1 wherein said cooling is terminated when the grooves in said silicon wafer are filled with epitaxially-grown silicon to a level below the surface of said silicon wafer.

6. The method of claim 1 wherein said cooling is terminated when the grooves in said silicon wafer are filled with epitaxially-grown silicon to a level above the surface of said silicon wafer.

7. The method of claim 1 wherein said melt is supersaturated with silicon.

8. The method of claim 7 wherein said cooling is terminated when the grooves in said silicon wafer are filled with epitaxially-grown silicon up to the surface of said silicon wafer.

9. The method of claim 8 including the step of removing said oxide layer from said wafer after said wafer is withdrawn from said melt.

10. The method of claim 9 including the step of diffusing impurities into the ungrooved surface portion of said wafer previously covered by said oxide layer so as to electrically interconnect successive filled grooves containing epitaxially-grown silicon.

11. The method of claim 7 wherein said cooling is terminated when the grooves in said silicon wafer are filled with epitaxially-grown silicon to a level below the surface of said silicon wafer.

12. The method of claim 7 wherein said cooling is terminated when the grooves in said silicon wafer are filled with epitaxially-grown silicon to a level above the surface of said silicon wafer.

13. A method of refilling the grooves in a silicon wafer of predetermined conductivity type by epitaxial growth of silicon from the liquid phase, comprising:

establishing an oxide layer on a surface of said silicon wafer;

etching grooves extending into said wafer through said oxide layer;

inserting said wafer into a melt supersaturated with silicon and containing conductivity type-determining impurities;

maintaining the melt at a constant temperature for a predetermined duration so as to fill the grooves with epitaxially-grown silicon to a desired extent; and withdrawing said wafer from said melt when said grooves are filled with epitaxially-grown silicon to said desired extent.

14. The method of claim 13 wherein said wafer is withdrawn from said melt when the grooves in said wafer are filled with epitaxially-grown silicon up to the surface of said silicon wafer.

15. The method of claim 14 including the step of removing said oxide layer from said wafer after said wafer is withdrawn from said melt.

16. The method of claim 15 including the step of diffusing impurities into the ungrooved surface portion of said wafer previously covered by said oxide layer so as to electrically interconnect successive filled grooves containing epitaxially-grown silicon.

17. The method of claim 13 wherein said wafer is withdrawn from said melt when the grooves in said wafer are filled with epitaxially-grown silicon to a level below the surface of said silicon wafer.

18. The method of claim 13 wherein said wafer is withdrawn from said melt when the grooves in said wafer are filled with epitaxially-grown silicon to a level above the surface of said silicon wafer.

* * * * *